US009634424B2

(12) United States Patent
Mackey et al.

(10) Patent No.: US 9,634,424 B2
(45) Date of Patent: Apr. 25, 2017

(54) INTEGRATED CONNECTION SYSTEM

(71) Applicant: Rockwell Automation Technologies, Inc., Mayfield Heights, OH (US)

(72) Inventors: Dennis C. Mackey, Ipswich, MA (US); JianHua Wang, Shanghai (CN); Michael Burdenko, Wellesley Hills, MA (US); Robert M. Black, Bolton, MA (US); Eric Clinton Henefield, Amherst, NH (US); Derek Washington Gallon, Arlington, MA (US); Suresh R. Nair, Amherst, NH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 375 days.

(21) Appl. No.: 14/265,128

(22) Filed: Apr. 29, 2014

(65) Prior Publication Data

US 2015/0055305 A1 Feb. 26, 2015

Related U.S. Application Data

(60) Provisional application No. 61/868,392, filed on Aug. 21, 2013.

(51) Int. Cl.
*H05K 1/14* (2006.01)
*H01R 13/514* (2006.01)
*H01R 13/66* (2006.01)

(52) U.S. Cl.
CPC ....... *H01R 13/514* (2013.01); *H01R 13/6683* (2013.01); *Y10T 29/49002* (2015.01)

(58) Field of Classification Search
CPC ....... H01R 11/30; H01R 13/641; H01R 33/00
USPC ...................... 361/728–730, 759; 439/37–39
See application file for complete search history.

(56) References Cited

U.S. PATENT DOCUMENTS

| | | | | |
|---|---|---|---|---|
| 8,226,420 | B2 * | 7/2012 | Chuang .................. | A61B 5/681 439/37 |
| 2007/0072442 | A1 * | 3/2007 | DiFonzo ............. | H01R 13/641 439/39 |
| 2009/0023336 | A1 * | 1/2009 | Kondo .............. | H01R 13/6474 439/607.01 |

* cited by examiner

*Primary Examiner* — Hung S Bui
(74) *Attorney, Agent, or Firm* — Amin, Turocy & Watson, LLP

(57) ABSTRACT

A modular connector system allows a user to configure physical and functional aspects of a sensor or electrical connector assembly to suit the requirements of a particular installation or application. A header module houses an electrical component, such as a photo sensor, a proximity switch, a safety sensor, etc. A variety of field modules and adapter modules are provided that can be selectively added to the header module to accommodate a wide range of applications. These field and adaptor modules can include power modules, communication modules, or other types of signal processing modules. The housings and electronics of the header, field, and adapter modules are designed such that the field and adapter modules can be rotated relative to the header module to suit physical environment of the connector's location.

17 Claims, 19 Drawing Sheets

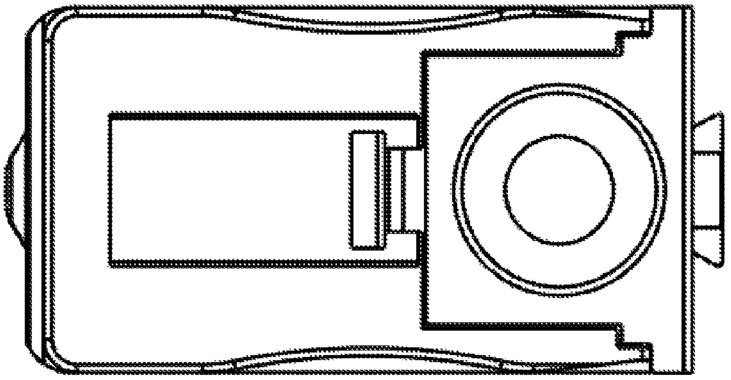
FIG. 9b
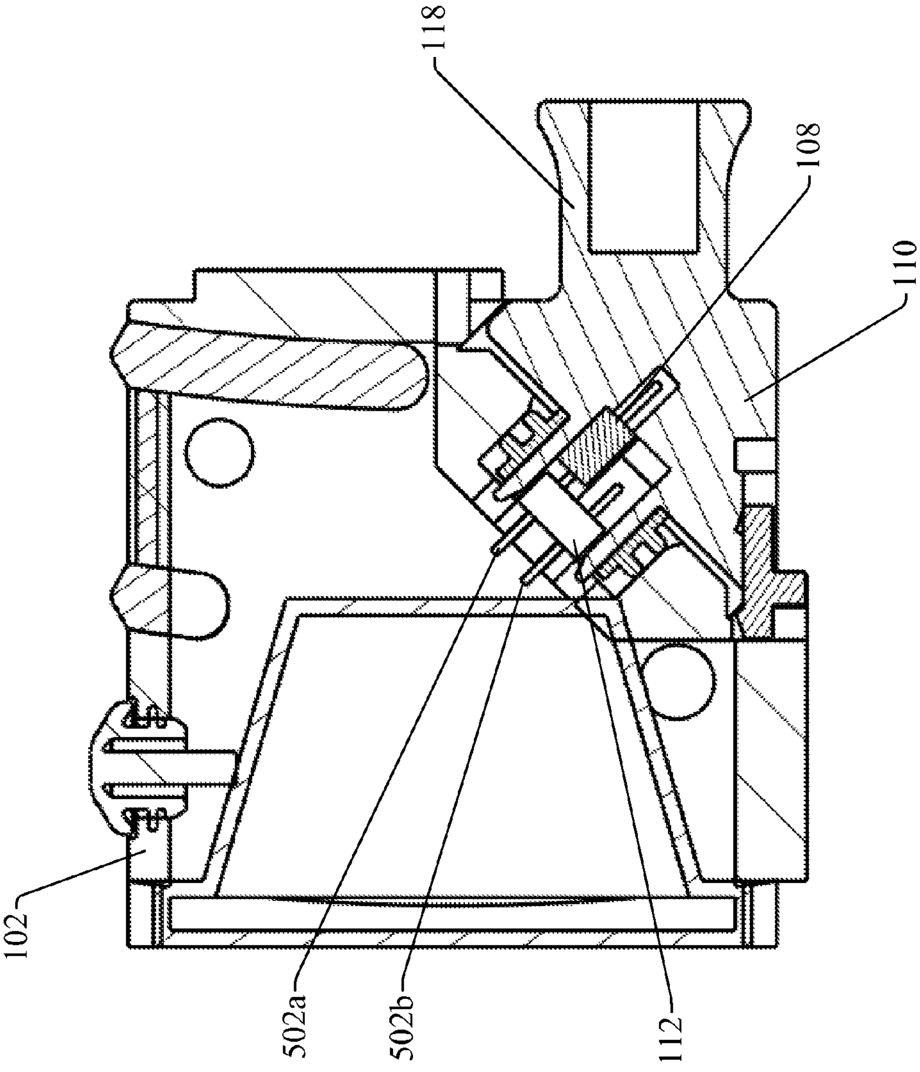

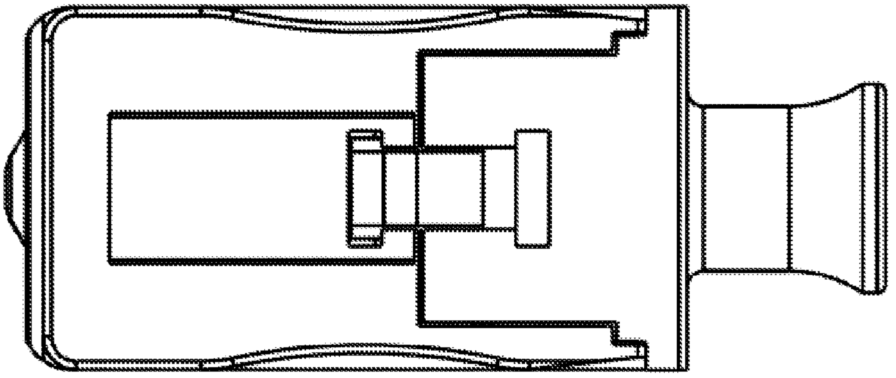
FIG. 10b
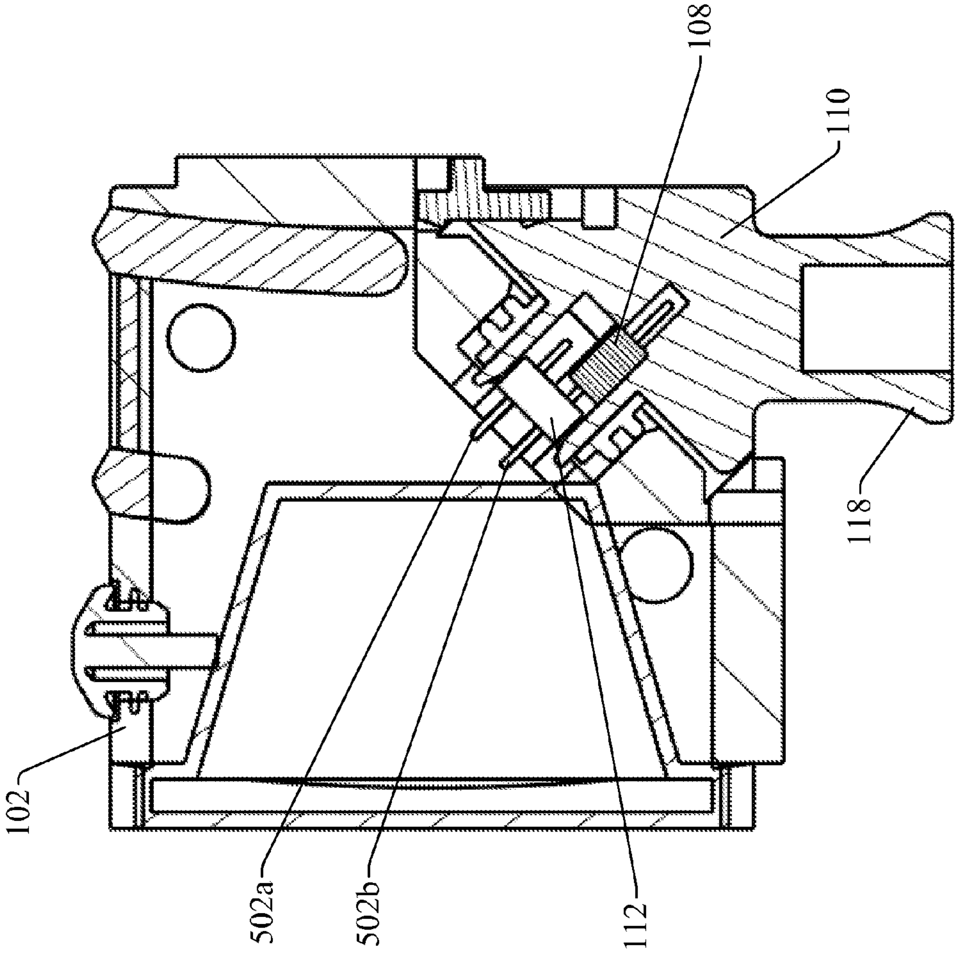

INTEGRATED CONNECTION SYSTEM

CROSS-REFERENCE TO RELATED APPLICATIONS

This application claims priority to U.S. Provisional Application Ser. No. 61/868,392, filed on Aug. 21, 2013, entitled "INTEGRATED CONNECTION SYSTEM," the entirety of which is incorporated by reference.

TECHNICAL FIELD

This disclosure relates generally to a modular connector assembly capable of physical and electrical reconfiguration in the field, and that allows different functional modules to be attached interchangeably to a common header module

BACKGROUND

Modern industrial automation and control systems typically include a number of field devices installed throughout the system, including but not limited photo sensors, proximity switches, safety sensors, and the like. These field devices often comprise a housing containing the device's internal electronic components and an interface port or cable that interfaces the device to a power supply and/or to an outside system that exchanges data with the device, such as an industrial controller.

The overall shape of such field devices is typically fixed, and is partly a function of the dimensions of the housing and the location and orientation of the cable port, which also determines the direction and orientation of the cable relative to the device housing. Although these features of the field devices—device shape and cable orientation—are generally fixed, the physical parameters of the industrial environments in which these devices are installed can vary considerably between installation locations. Consequently, the shape of the device and/or the direction in which the cable enters the device may not be ideal for a particular installation location.

The above-described deficiencies of today's electronic field devices are merely intended to provide an overview of some of the problems of conventional systems, and are not intended to be exhaustive. Other problems with conventional systems and corresponding benefits of the various non-limiting embodiments described herein may become further apparent upon review of the following description.

SUMMARY

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later One or more embodiments of the present disclosure relate to a modular connection system that allows a user to configure multiple physical or functional aspects of a field device (e.g., a sensor, a switch, etc.) in order to conform to the conditions of a particular installation location or application. To this end, various types of modular components are provided that can be combined to yield a device assembly suitable for a particular industrial application. The modular components are configured to be combinable according to at least two different orientations relative to each other, where each orientation yields a different overall shape and cable orientation for the device. This configuration allows the user to select a shape that best suits the unique conditions of the installation location.

The modular components can include header module that houses electrical components (e.g., a photo sensor, proximity switch, safety sensor, etc.), field modules with associated cables or interface ports that can be attached to the header module to create a power or signaling interface to the electronic component, adaptor modules that can be attached to the header module and which can perform signal processing or power transformation on incoming signals or power, or other such modules. Header modules are compatible with any type of field or interface module, affording the user a degree of control over the functionality and shape of the resulting field device. For example, the modular system allows the user to choose the electrical options needed for a particular sensing application, and to physically reconfigure the assembly to fit the installation requirements of the particular application.

Moreover, the electrical interfaces of the header, field, and adapter modules are designed such that the user can re-orient a multi-conductor connector without the need to re-wire the electrical connection. For example, the contacts of the module interfaces can be designed such that rotating the field or adapter module 180 degrees relative to the header module causes the pin-outs between the header module and the field/adapter module to be automatically reconfigured for proper signal or power exchange. Also, by providing different types of adapter modules supporting different communication capabilities (e.g., Ethernet, Bluetooth, etc.), the system allows the user to easily select or modify a communication protocol for the field device.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

FIG. 9*b* is a two-view drawing of a field module attached to a header module in a first orientation.

FIG. 10*b* is a two-view drawing of a field module attached to a header module in the second orientation.

DETAILED DESCRIPTION

Figure 1B:
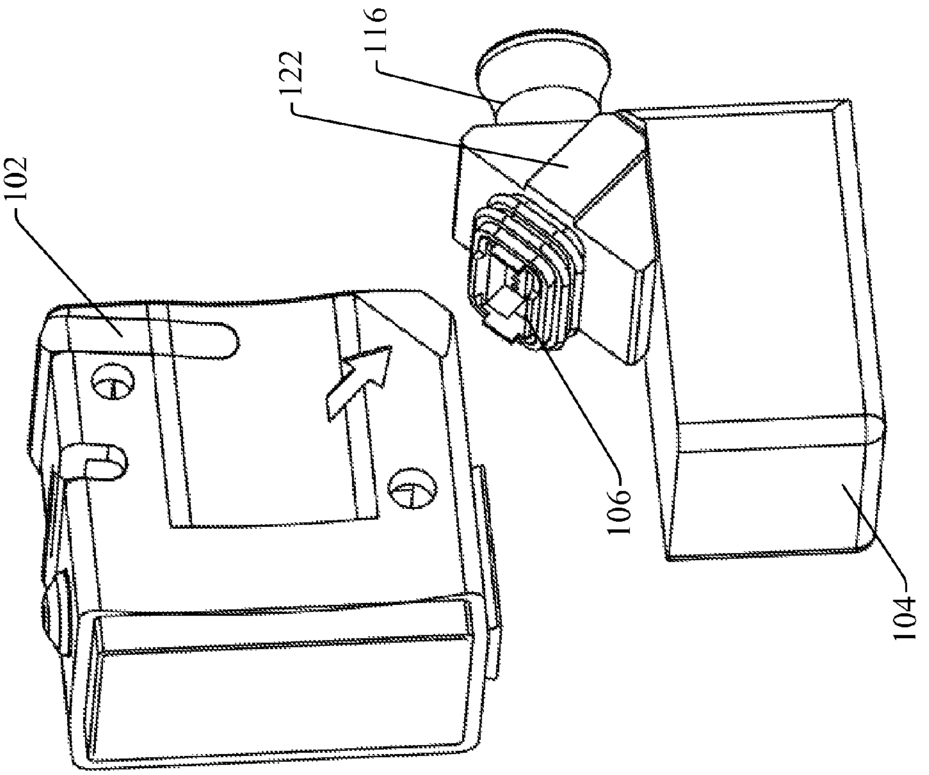
FIG. 1*b* is second three-dimensional view of a header module and an adapter module oriented in the first orientation.

Various aspects of this disclosure are now described with reference to the drawings, wherein like reference numerals are used to refer to like elements throughout. In the following description, for purposes of explanation, numerous specific details are set forth in order to provide a thorough understanding of one or more aspects. It should be understood, however, that certain aspects of this disclosure may be practiced without these specific details, or with other methods, components, materials, etc. In other instances, well-known structures and devices are shown in block diagram form to facilitate describing one or more aspects.

The modular connection system described herein can allow a user to configure multiple facets of a sensor or electrical connector assembly to suit the requirements of a particular installation or application. This can include configuration of both physical and functional aspects of the connector assembly. To this end, an electrical component (e.g., a photo sensor, a proximity switch, a safety sensor, or substantially any type of electrical component) can be housed in a header module. A variety of field modules and adapter modules are provided that can be selectively added to the header module to accommodate a wide range of applications. These field and adaptor modules can include power modules (e.g., DC, AC, etc.), communication modules (e.g., Ethernet, Bluetooth, etc.), or other types of signal processing modules. The housings and electronics of the header, field, and adapter modules are designed such that the field and adapter modules can be rotated relative to the header module to suit physical environment of the connector's location.

Figure 1A:
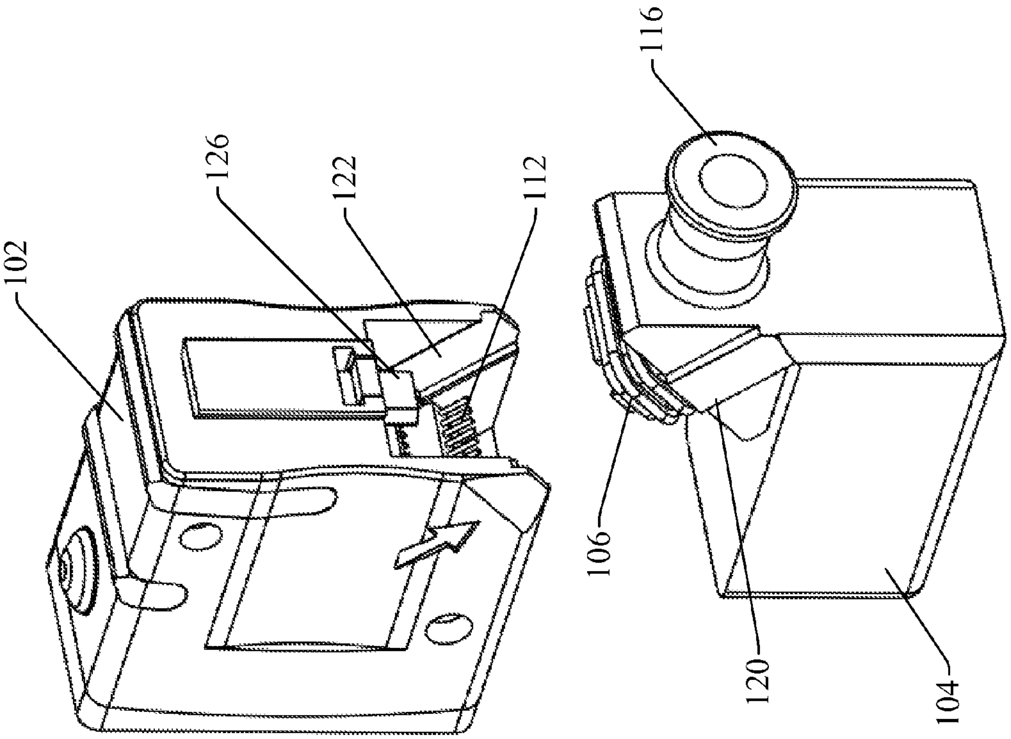
FIG. 1*a* is a first three-dimensional view of a header module and an adapter module oriented in a first orientation.

FIGS. 1*a* and 1*b* illustrate three-dimensional views of a header module and an adapter module according to one or more embodiments. Header module 102 houses a sensor, switch, or other electrical component (e.g., a photo sensor, a proximity switch, a safety switch, etc.) configured to be installed or mounted in a fixed location as part of an industrial automation system. The connector assembly is completed by addition of an adapter module 104. Header module 102 includes a header interface 112 configured to electrically connect to an adapter interface 106 on adapter module 104. Inside the header module 102, the conductive contacts (e.g., pins) of header interface 112 are electrically interfaced with electronics housed in header module 102, such that power and/or signals can be passed between the header module circuitry and header interface 112. Guide rails 120 on adapter module 104 are configured to slide into guide grooves 122 on header module 102, ensuring that the female connectors of adapter interface 106 are properly aligned with the male connectors of header interface 112 before the two interfaces are brought together during assembly. Retractable locking tongue 126 on header module 102 is configured to slide into a locking groove on adapter module 104 to facilitate locking the modules together.

Adapter interface 106 has an attached cable or connector port 116 for receiving a multi-conductor cable comprising conductors for conveying signal and/or power to be mated with an external connector. Examples of mated connectors include but are not limited to M5, M8, M12, and ½-20 threaded connectors. The conductors of the multi-conductor cable are electrically connected to the conductive contacts of adapter interface 106, such that adapter interface 106 passes signals and/or power between the cable conductors and the electrical contacts of header interface 112 when adapter module 104 is attached to header module 102. The multi-conductor cable will typically terminate at a customer-facing connector or device (not shown) at the opposite end of the cable. The location and orientation of cable or connector port 116 is not limited to the location and orientation depicted in FIGS. 1*a* and 1*b*. Rather, various embodiments of adapter module 104 can include cable ports positioned at any suitable location on the module (see, e.g., FIGS. 11*a*-11*c*, discussed below)

In one or more embodiments, the mechanisms for connecting header module 102 to adapter module 104 are configured to allow adapter module 104 to be connected to header module 102 in either of two possible orientations—a first orientation or a second orientation that is rotated 180 degrees relative to the first orientation. This modular connector design can allow the user to select or change the orientation of the connector assembly to suit the physical environment of the connector. FIGS. 1*a* and 1*b* depict the header module 102 and adapter module 104 oriented in the first orientation. When assembled in the first orientation, cable port 116 extends from the rear surface of the resulting sensor assembly, and the height of the sensor assembly is greater than the depth.

Figure 2B:
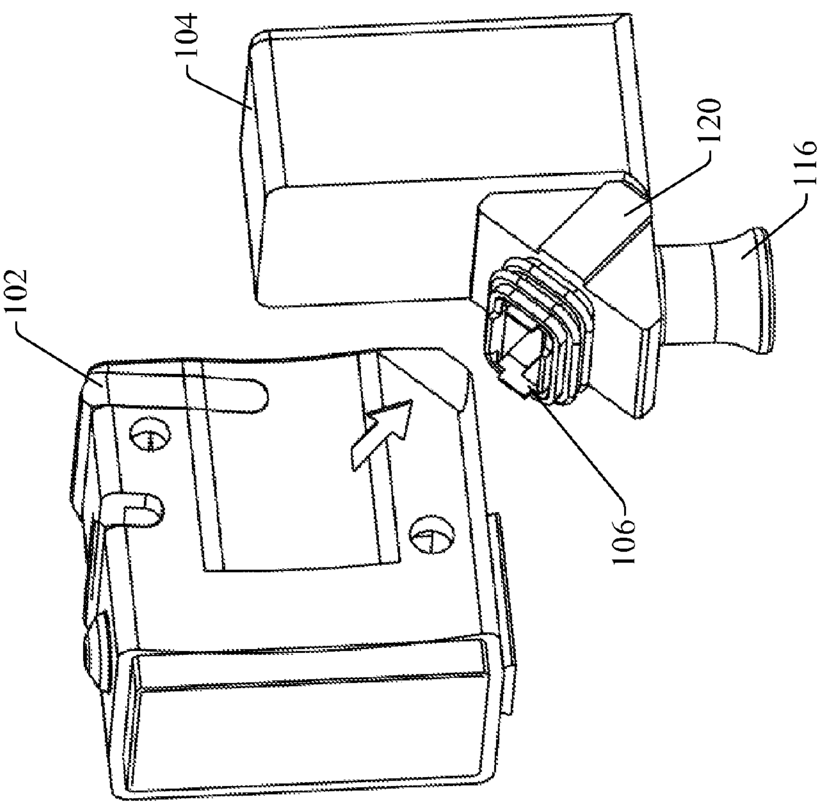
FIG. 2*b* is a second three-dimensional view of a header module and an adapter module oriented in the second orientation.
Figure 2A:
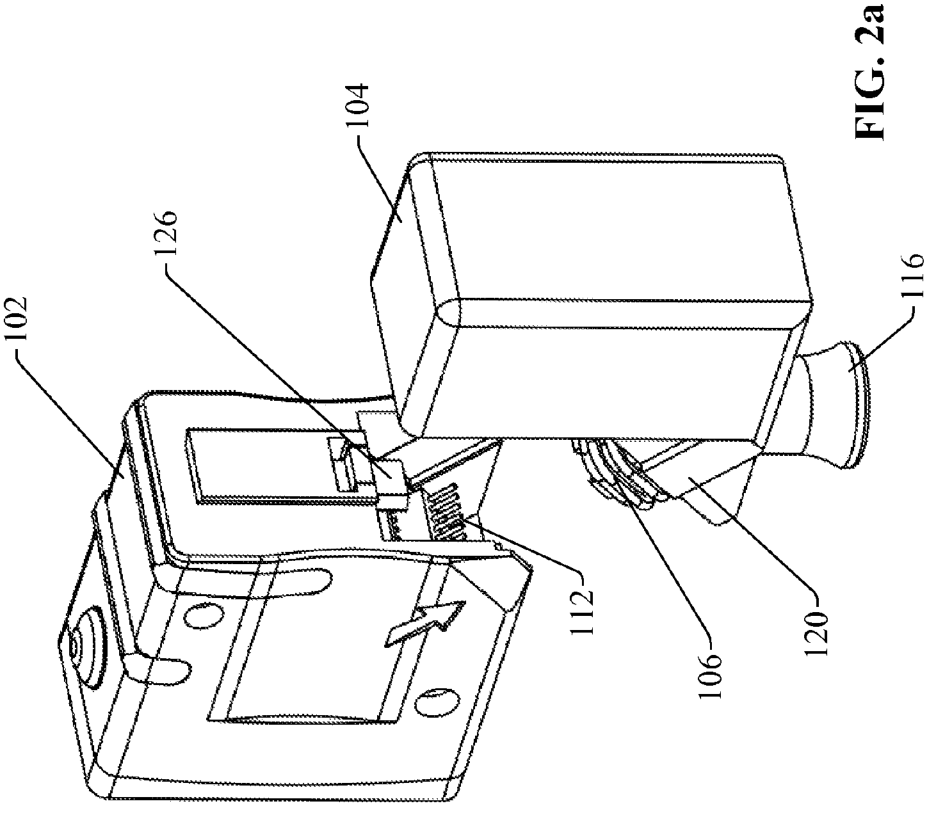
FIG. 2*a* is a first three-dimensional view of a header module and an adapter module oriented in a second orientation.

FIGS. 2*a* and 2*b* depict header module 102 and adapter module 104 arranged according to the second orientation, which is achieved by rotating adapter module 104 180 degrees relative to the first orientation. When assembled in the second orientation, cable or connector port 116 now extends from a bottom surface of the resulting sensor assembly, and the sensor assembly now has a depth that is greater than its height. The mechanical and electrical designs that allow the modules to be assembled in either orientation while maintaining correct electrical throughput will be described in more detail below.

Figure 3B:
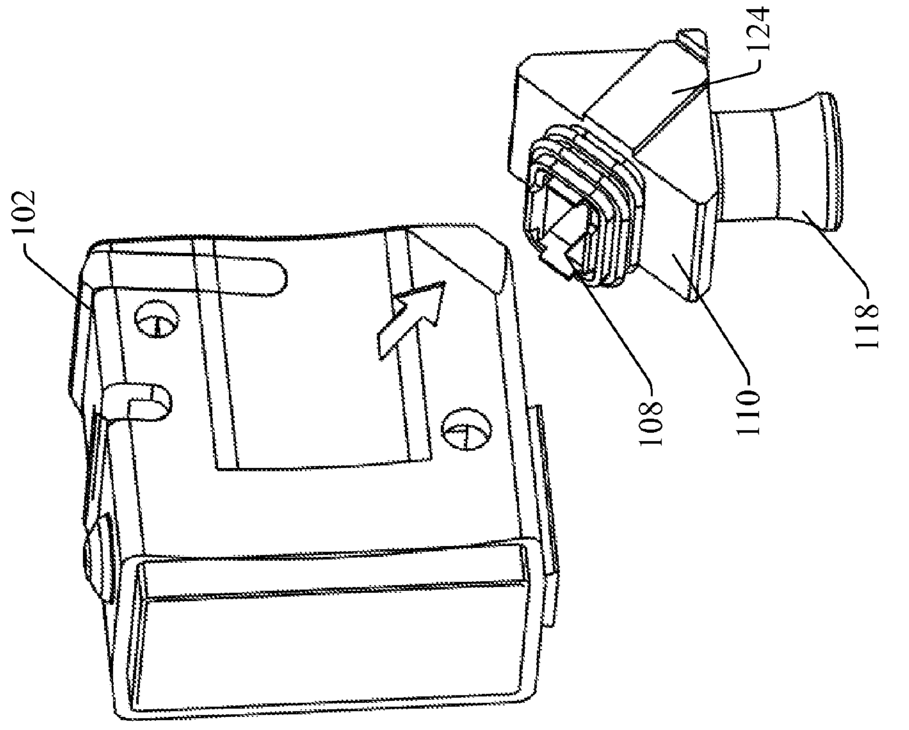
FIG. 3*b* is a second three-dimensional view of a header module and a field module oriented in the first orientation.
Figure 3A:
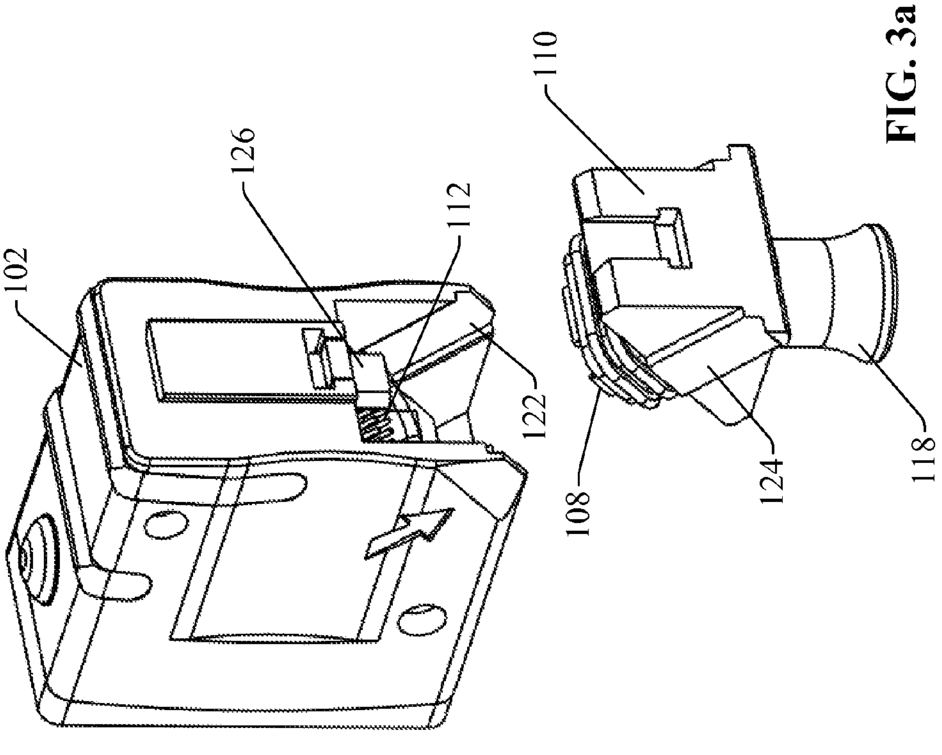
FIG. 3*a* is a first three-dimensional view of a header module and a field module oriented in a first orientation.
Figure 4B:
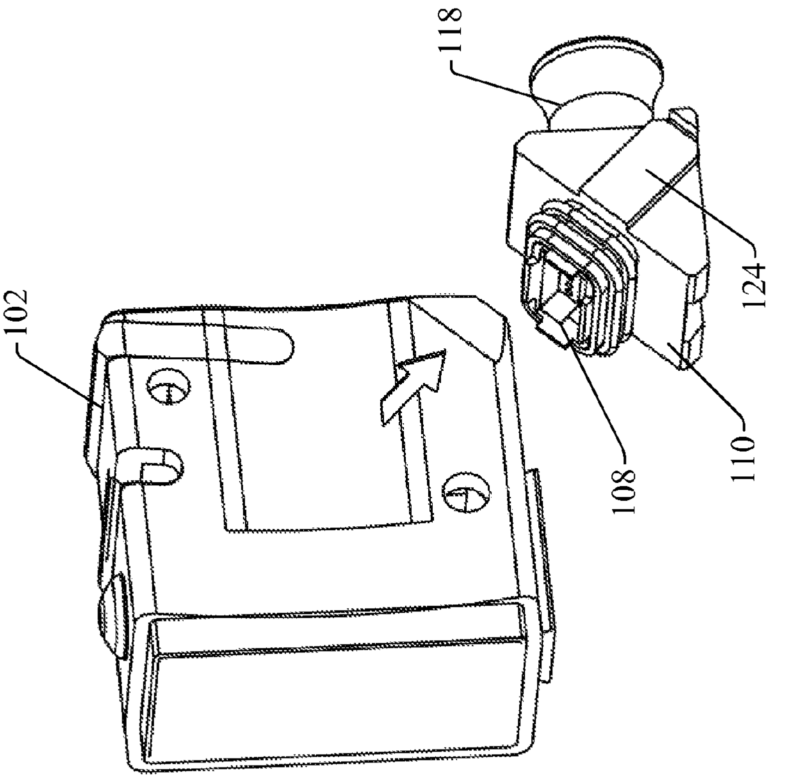
FIG. 4*b* is a second three-dimensional view of a header module and a field module oriented in the second orientation.
Figure 4A:
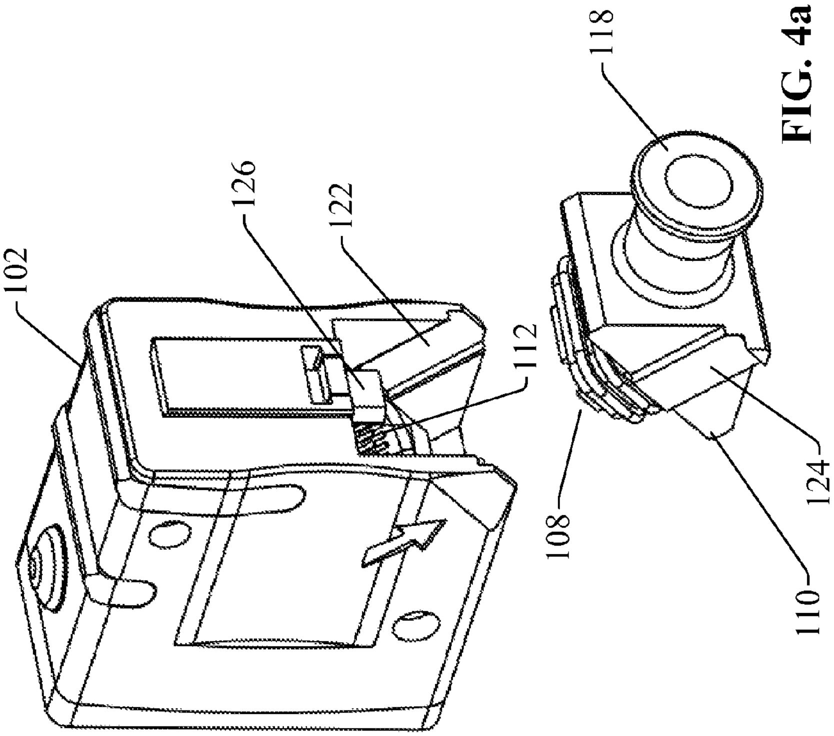
FIG. 4*a* is a first three-dimensional view of a header module and a field module oriented in a second orientation.

In addition to adapter module 104, header module 102 is also configured to be compatible with another type of module referred to herein as a field module. FIGS. 3*a* and 3*b* illustrate three-dimensional views of a header module and a field module according to one or more embodiments. Similar to adapter module 104, field module 110 includes an attached cable or connector port 118 for receiving a multi-conductor cable (or to be mated with an external connector) having conductors that are electrically connected to the contacts of field module interface 108, allowing power and/or signals to pass between the contacts of header interface 112 and the conductors of the multi-conductor cable when field module 110 is attached to header module 102. Guide rails 124 on field module 110 are designed to slot into guide grooves 122 of header module 102 to ensure proper alignment of the modules before the interfaces are connected. Like adapter module 104, field module 110 can be attached to header module 102 in either of two orientations. FIGS. 3*a* and 3*b* illustrate header module 102 and field module 110 oriented in the first orientation. FIGS. 4*a* and 4*b* illustrate header module 102 and field module 110 oriented in the second orientation, which is achieved by rotating field module 110 180 degrees relative to the first orientation.

In general, field module 110 and adapter module 104 differ in that field module 110 performs no processing or manipulation of power or signals passed between header module 102 and the cable or connector port 118, whereas adapter module 104 can include circuitry and/or software for processing or manipulating the power/signals passed between header module 102 and the cable or connector port 116, thereby enhancing operation of header module 102. For example, one type of header module 102 (e.g., a sensor header module) may be configured to operate on DC power. In this scenario, a field module 110 may be used to deliver DC power to header module 102. Accordingly, the customer-side end of a cable or mated connector running through cable or connector port 118 may be wired or plugged into a DC power source, such that DC power is supplied to the header module 102 via field module interface 108 and header interface 112 when field module 110 is connected to header module 102. Another type of field module 110 may be used to pass signaling (instead of or in addition to DC power) between header module 102 and customer equipment at the customer end of the cable if no processing or manipulation of the signaling is required between header module 102 and the customer equipment.

Adapter module 104 may also be used to deliver power to header module 102. However, whereas field module 110 is used to deliver DC power, which requires no conditioning or transformation prior to delivery to the header module 102, adapter module 104 can be configured to supply AC power to header module 102. In such applications, adapter module 104 can include power conditioning components (e.g., a transformer or other power conditioning circuitry) required to transform incoming AC power to a voltage level required for the electrical component housed by header module 102. Another example adapter module may include circuitry and/or software for processing signals passed between header module 102 and devices at the customer end of the multi-conductor cable or mated connector. For example, various protocol-specific adapter modules may be provided that support a range of communication protocols (e.g., Ethernet signals, Bluetooth signals, etc.). The modular connector design described herein can thus allow a user to easily select or change a communication protocol for communicating with header module 102 by selection of a suitable adapter module 104.

Figure 5A:
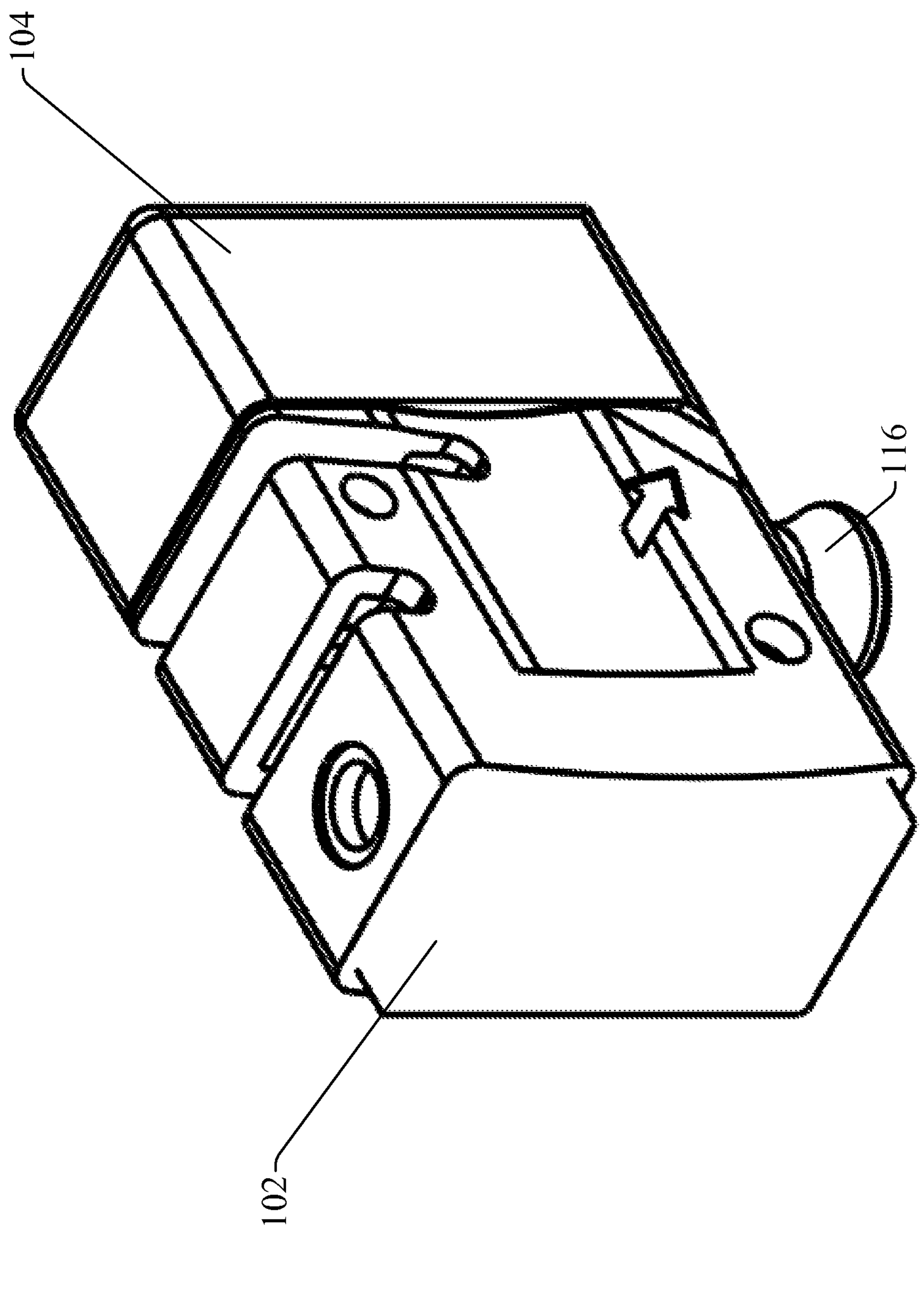
FIG. 5*a* is a three-dimensional view of an assembled connector comprising a header module and an adapter module assembled in a first orientation.

FIG. 5*a* is a three-dimensional view of an assembled connector comprising a header module 102 and an adapter module 104 assembled in a first orientation. Although FIG. 5*a* illustrates an adapter module 104 connected to the header module 102, it is to be understood that a similar connection mechanism can be used to connect a field module 110 to header module 102.

Figure 5B:
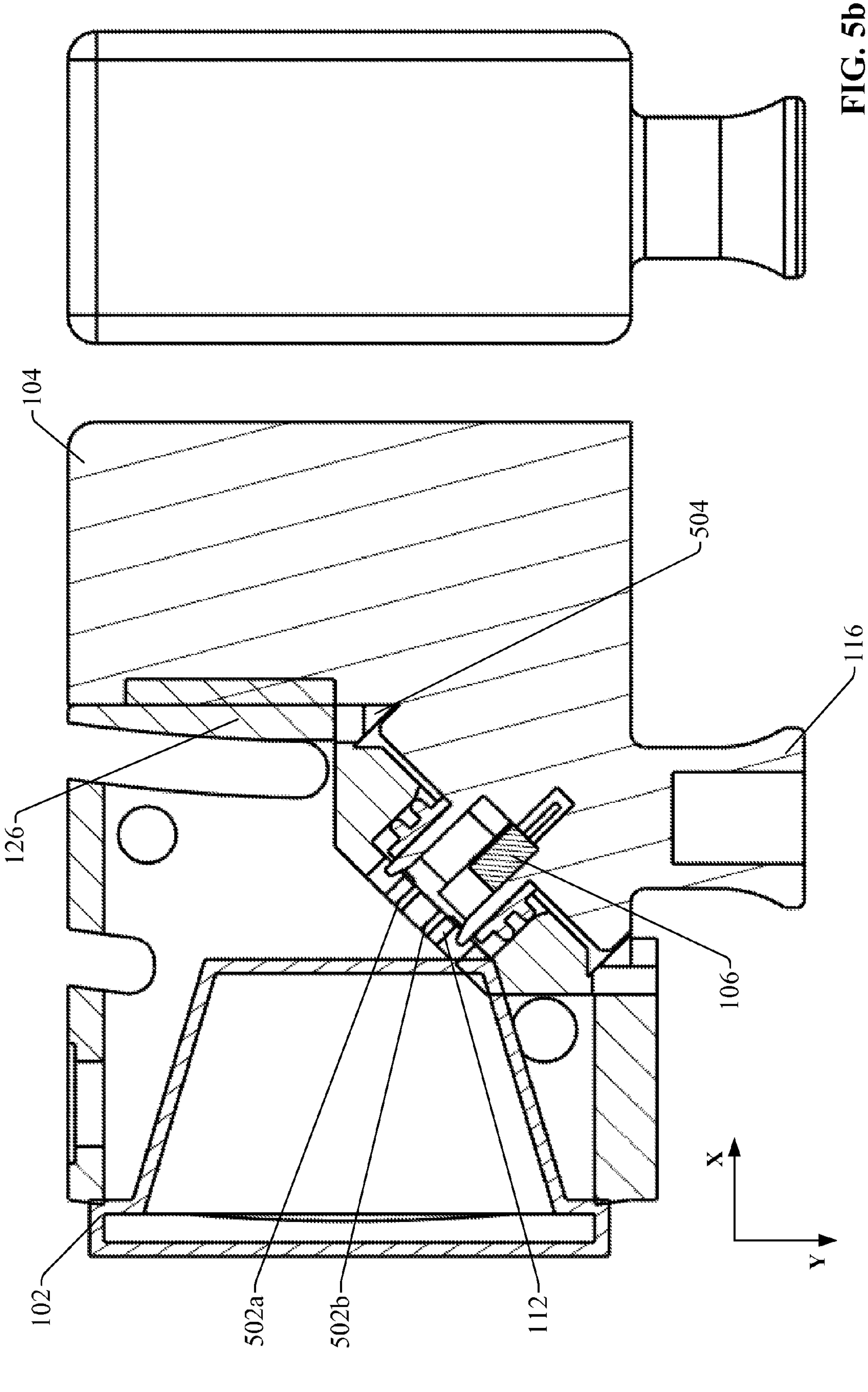
FIG. 5*b* is a two-view drawing of the header module and adapter module assembled in the first orientation.
Figure 5C:
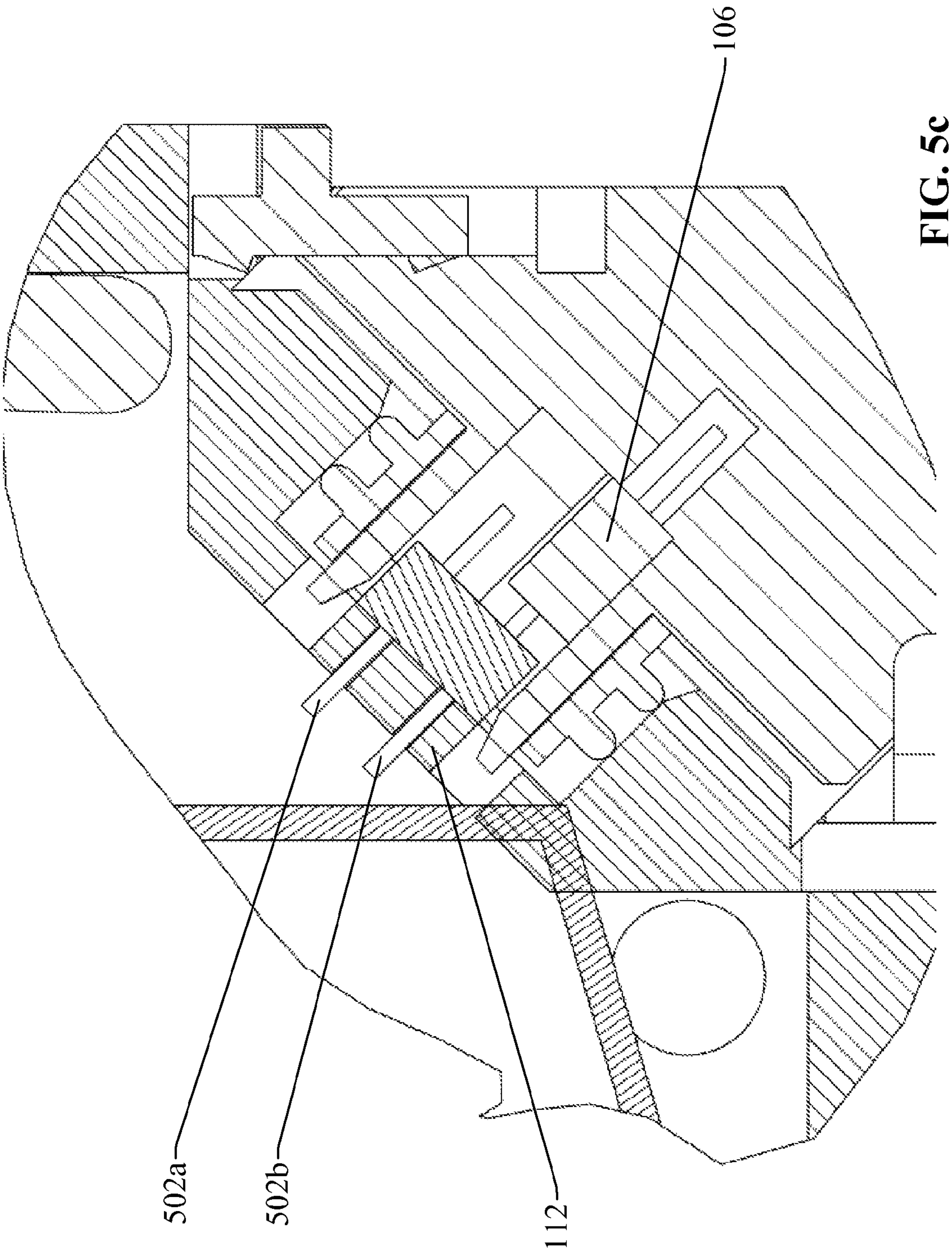
FIG. 5*c* is a cross-section of an interface region between a header module and an adapter module.

FIG. 5*b* is a two-view drawing of the first orientation depicted in FIG. 5*a*. This view more clearly illustrates the connection of header interface 112 and adapter interface 106. In this example, header interface 112 comprises two rows of electrical contacts (e.g., male pins)—502*a* and 502*b*, while adapter interface 106 comprises a single row of contacts (e.g., female pin sockets). When connected together in the first orientation, as depicted in FIGS. 5*a* and 5*b*, the single row of contacts of adapter interface 106 is positioned to mate with the lower row of contacts 502*b* of header interface 112. Although FIG. 5*b* depicts the electrical contacts of header interface 112 and adapter interface 106 as being conductive pins, the electrical contacts can comprise any suitable contact type, including but not limited to metal contact pads that make contact when the modules are assembled. Turning briefly to FIG. 5*c*, the connection between header interface 112 and adapter interface 106 is shown in a closer view.

As shown on FIGS. 1*a*, 2*a*, 3*a*, and 4*a*, a retractable locking tongue 126 locks adapter module 104 or field module 110 to header module 102 by sliding into a locking notch 504. Although the drawings depict locking tongue 126 as residing on the header module 102 and latching notch 504 as located on the adapter module 104 or field module 110, locking tongue 126 may reside on adapter module 104 or field module 110 rather than on header module 102 in some embodiments. Accordingly, locking notch 504 will be located on header module 102 in such embodiments. Once locked, retractable locking tongue 126 can be retracted into the housing of header module 102 to unlock and remove the module. Although FIGS. 1*a*, 2*a*, 3*a*, and 4*a* depict a retractable locking tongue 126 as the locking mechanism, any suitable locking mechanism for affixing adapter module 104 to header module 102 is within the scope of one or more embodiments of this disclosure, including but not limited to internal clips, external clips, or screws.

As shown in FIGS. 5*a* and 5*b*, it can be seen that the first orientation results a sensor assembly that is longer in the X direction than in the Y direction, with the cable or connector port 116 extending from a bottom surface of the assembly.

Figure 6A:
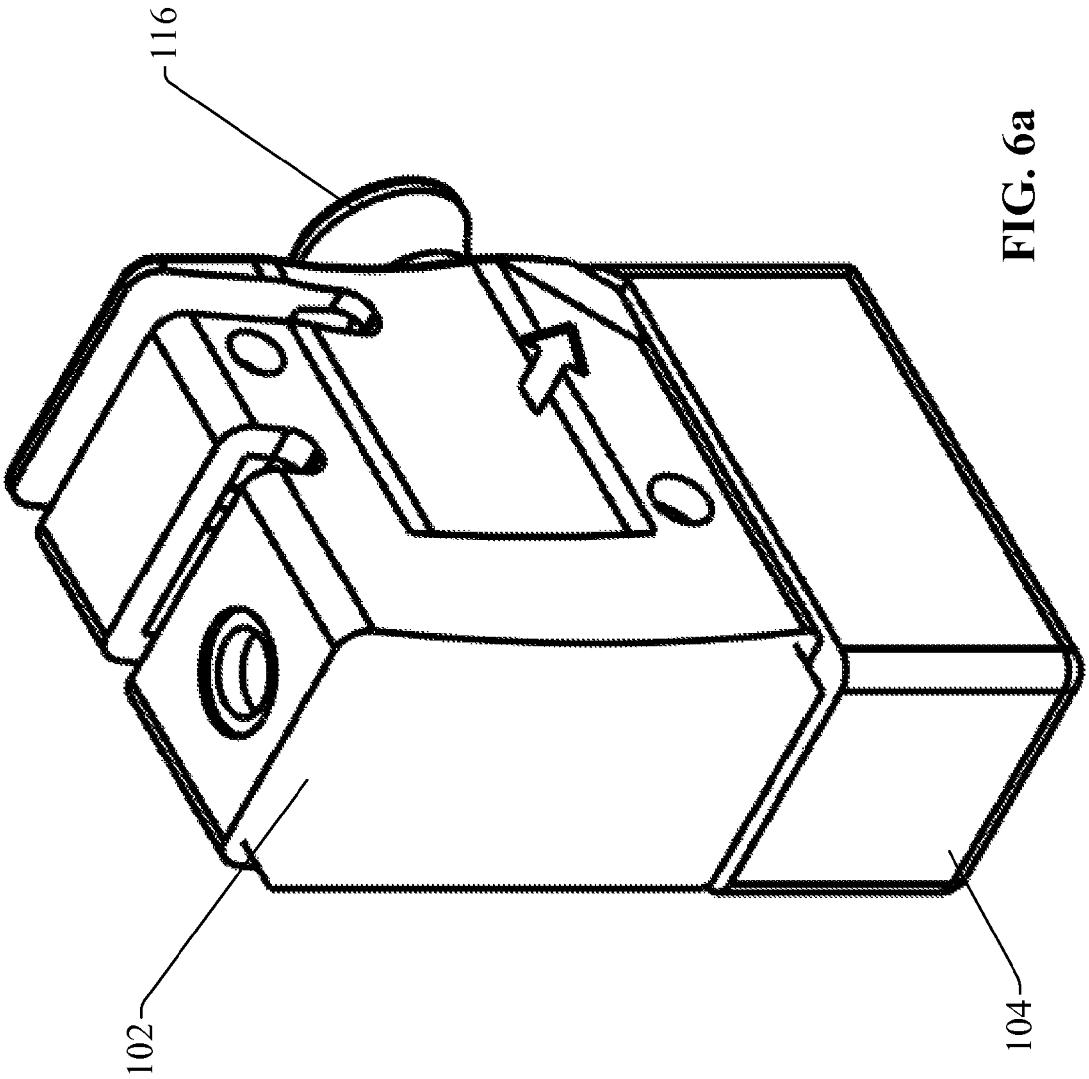
FIG. 6*a* is a three-dimensional view of the header module and adapter module assembled according to a second orientation.

FIG. 6*a* is a three-dimensional view of the header module 102 and adapter module 104 assembled according to the second orientation. The second orientation is achieved by rotating adapter module 104 180 degrees relative to the first orientation. The modules are designed such that the header interface 112 and adapter interface 106 connect together in both the first and second orientation. However, in the second orientation adapter interface 106 is now rotated 180 degrees relative to the first orientation. As will be explained in more detail below, the header and adapter interfaces are designed such that correct electrical connections are maintained in both orientations without the need to manually rewire the modules.

Figure 6B:
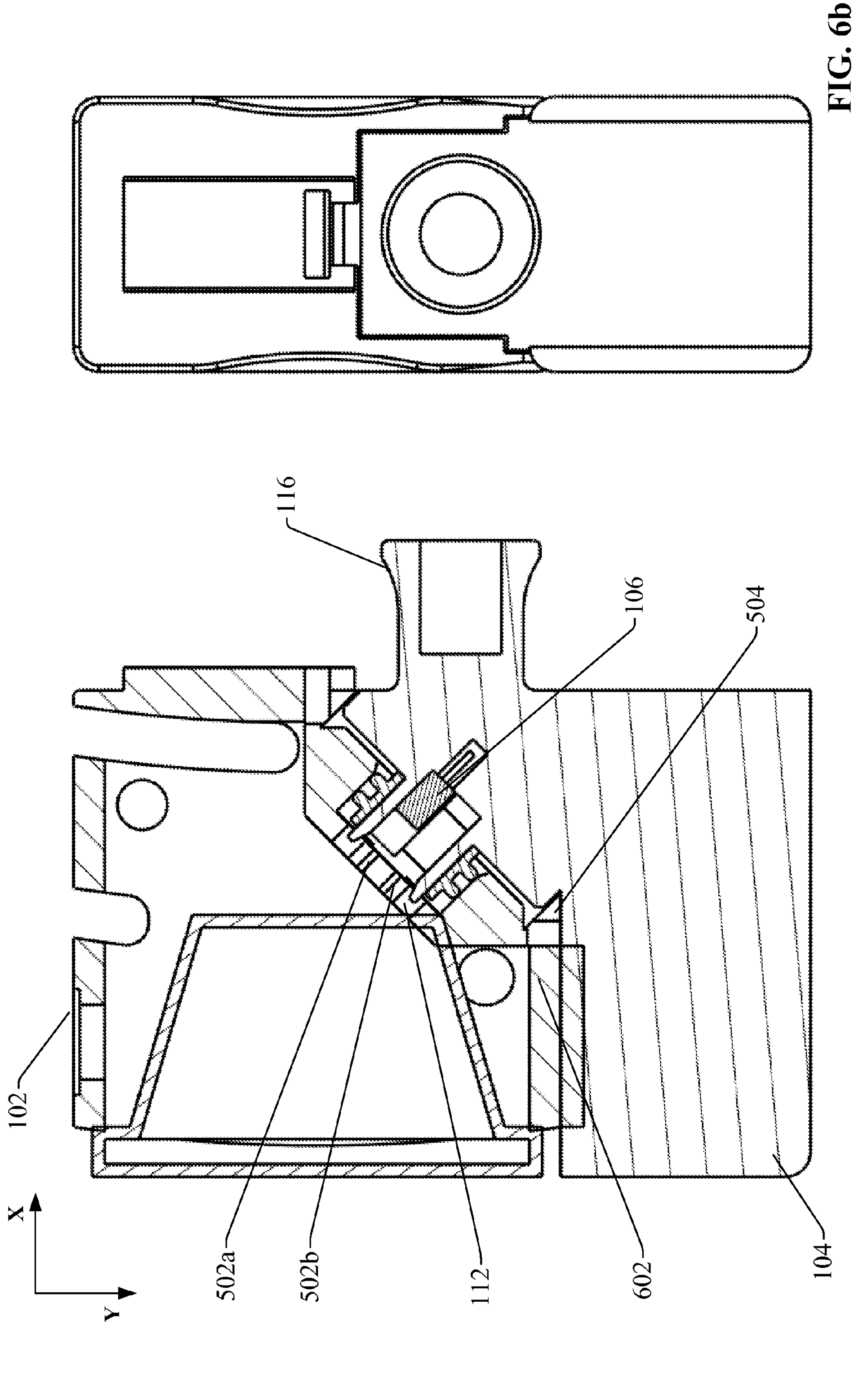
FIG. 6*b* is a two-view drawing of the header module and adapter module assembled in the second orientation.

FIG. 6*b* is a two-view drawing of the second orientation depicted in FIG. 6*a*. As depicted in this figure, locking notch 504 of adapter module 104 is now located at the bottom of header module 102. Accordingly, a second retractable locking tongue 602 is provided on the bottom surface of header module 102 to lock adapter module 104 while in the second orientation. In the second orientation, the connector assembly is longer in the Y-axis direction than in the X-axis direction. Moreover, the cable or connector port 116 of adapter module 104 now extends from the rear surface of the assembly, rather than extending from the bottom surface as in the first orientation. It is to be appreciated, however, that some versions of adapter module 104 may be designed to maintain the same general positioning and angle of cable or connector port 116 in both the first and second orientations, while other versions (like the version depicted in FIGS. 5*a*, 5*b*, 6*a*, and 6*b*) may be designed to offset the angle of cable or connector port 116 between the two positions.

As shown in FIG. 6*b*, the contacts of adapter interface 106 are offset in the second orientation relative to the first orientation, such that the adapter interface contacts now connect to the upper row of contacts 502*a* of header interface 112. As will be explained in more detail below, the header interface 112 is designed to ensure that correct electrical interfacing between the adapter interface 106 and the electrical circuitry housed within header module 102 is maintained in both the first and second orientations without the need to rewire the modules.

The modular design described above allows the user to set the desired assembly orientation as needed to suit the physical limitations of the installation environment. Since the adapter interface 106 is rotated 180 degrees between the first and second orientations while the orientation of header interface 112 remains constant, the adapter and header interfaces are configured such that the electrical connections between the adapter interface 106 and the header module circuitry remain the same in both orientations, thereby mitigating the need to rewire the modules when the adapter module orientation is changed. Moreover, as can be seen in FIGS. 5*b* and 6*b*, the plane of the connection interface between the header interface 112 and the adapter interface 106 faces substantially 45 degrees relative to the x- or y-direction. Since the cable or connector port 116 faces generally in the x-direction or the y-direction in these illustrated examples, the 45 degree orientation of the connection interface can mitigate the amount of cable pull force that is transferred to the connection interface, reducing the possibility of accidental disassembly of the components due to tension on the cable.

Figure 7A:
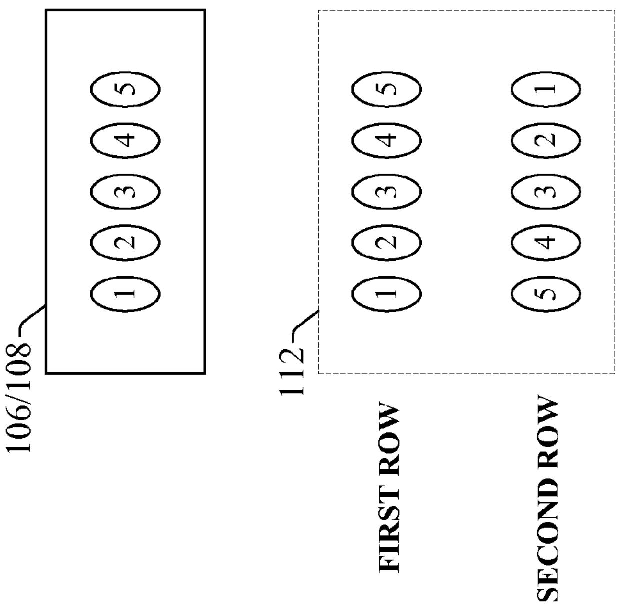
FIGS. 7*a-c* illustrate an adapter interface and a header interface that maintain correct signal throughput between a header module and an adapter module in a first and second module orientation.
Figure 7B:
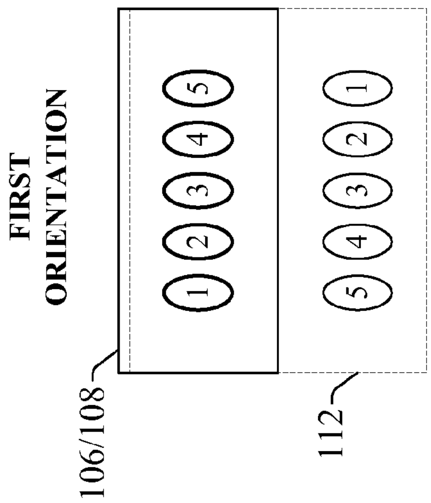
Figure 7C:
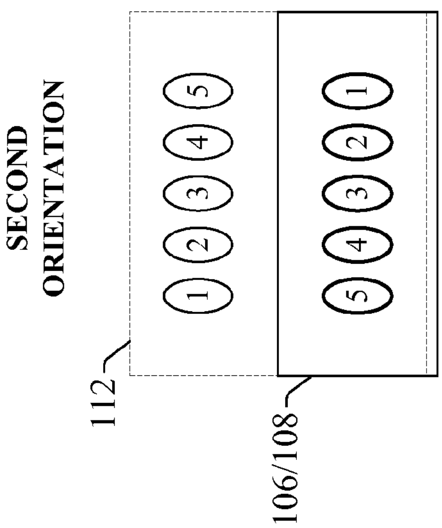

FIGS. 7*a*-7*c* illustrate an example interface design for maintaining the correct electrical signal throughput between the header module and the adapter module (or field module) in both orientations. As illustrated in FIG. 7*a*, an example adapter interface 106 (or field module interface 108) comprises five electrical contacts, numbered one through five from left to right (however, the respective interfaces may comprise any number of contacts depending on the interfacing requirements of the device). The five electrical contacts of adapter interface 106 (or field module interface 108) are configured to mate with five corresponding electrical contacts of header interface 112 when the modules are connected together as described above. In this example design, header interface 112 comprises two rows of electrical contacts, where each row is configured to mate with the contacts of adapter interface 106 in one of the two orientations. In FIGS. 7*a*-7*c*, the contacts of header interface 112 are numbered to illustrate correspondence with the contacts of adapter interface 106 (or field module interface 108). That is, electrical contact 1 of the first row of contacts of header interface 112 is configured to connect with electrical contact 1 of adapter interface 106 (or field module interface 108) in the first orientation, while electrical contact 1 of the second row of electrical contacts of header interface 112 is configured to connect with electrical contact 1 of adapter interface 106 (or field module interface 108) in the second orientation.

The second row of contacts of header interface 112 can be cross-wired into the component circuitry of header module 102 relative to the first row of contacts, as represented by the reverse numbering of the second row of contacts. For example, if the connector assembly is used for a safety application, contacts 1-5 may represent, respectively, (1) DC Power Input, (2) Ground, (3) OSSD (output signal switching device) Output, (4) Safety Input, and (5) Lock Command. For sensing applications, contacts 1-5 may represent (1) Input, (2) Output, and (3-5) Teach. As illustrated in FIG. 7*b*, when the adapter module is connected to the header module in the first orientation, the contacts of adapter interface 106 connect to the corresponding contacts of the first row of contacts of header interface 112. If the adapter module is connected to the header module in the second orientation, as illustrated in FIG. 7*c*, the adapter interface 106 is rotated 180 degrees, reversing the order of the electrical contacts. The interfaces are designed such that the contacts of adapter interface 106 and field module interface 108 are offset in the second orientation relative to the first orientation, causing the interface contacts to connect to the second row of contacts of the header interface 112, which are cross-wired relative to the first row. Thus, the correct electrical interfacing is maintained between the contacts of adapter interface 106 (or field module interface 108) and the electrical component housed in the header module.

Figure 8A:
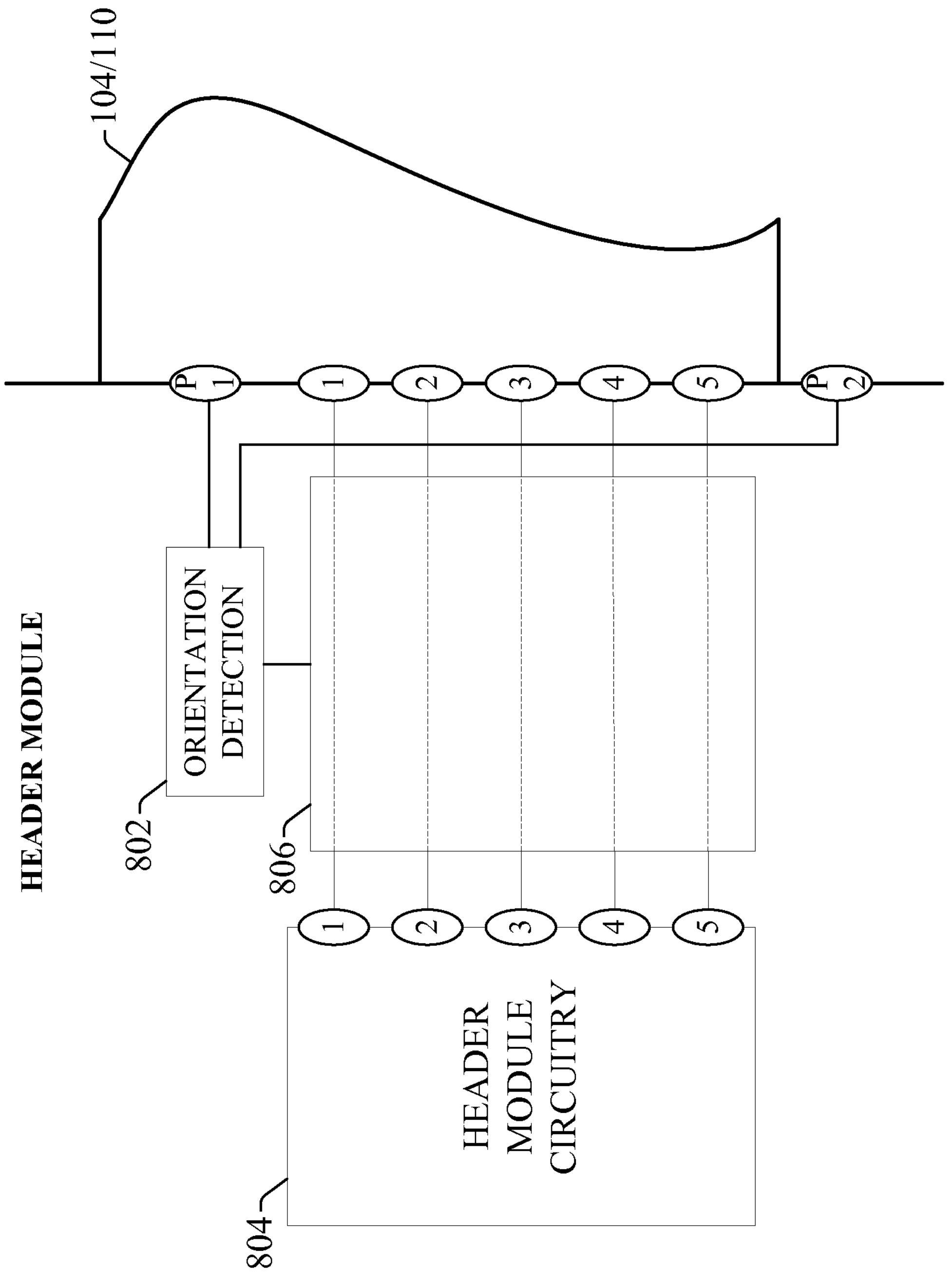
FIG. 8*a* illustrates a header module interface that automatically configures electrical connections between an adapter module and header module circuitry based on detection of a first adapter module orientation.
Figure 8B:
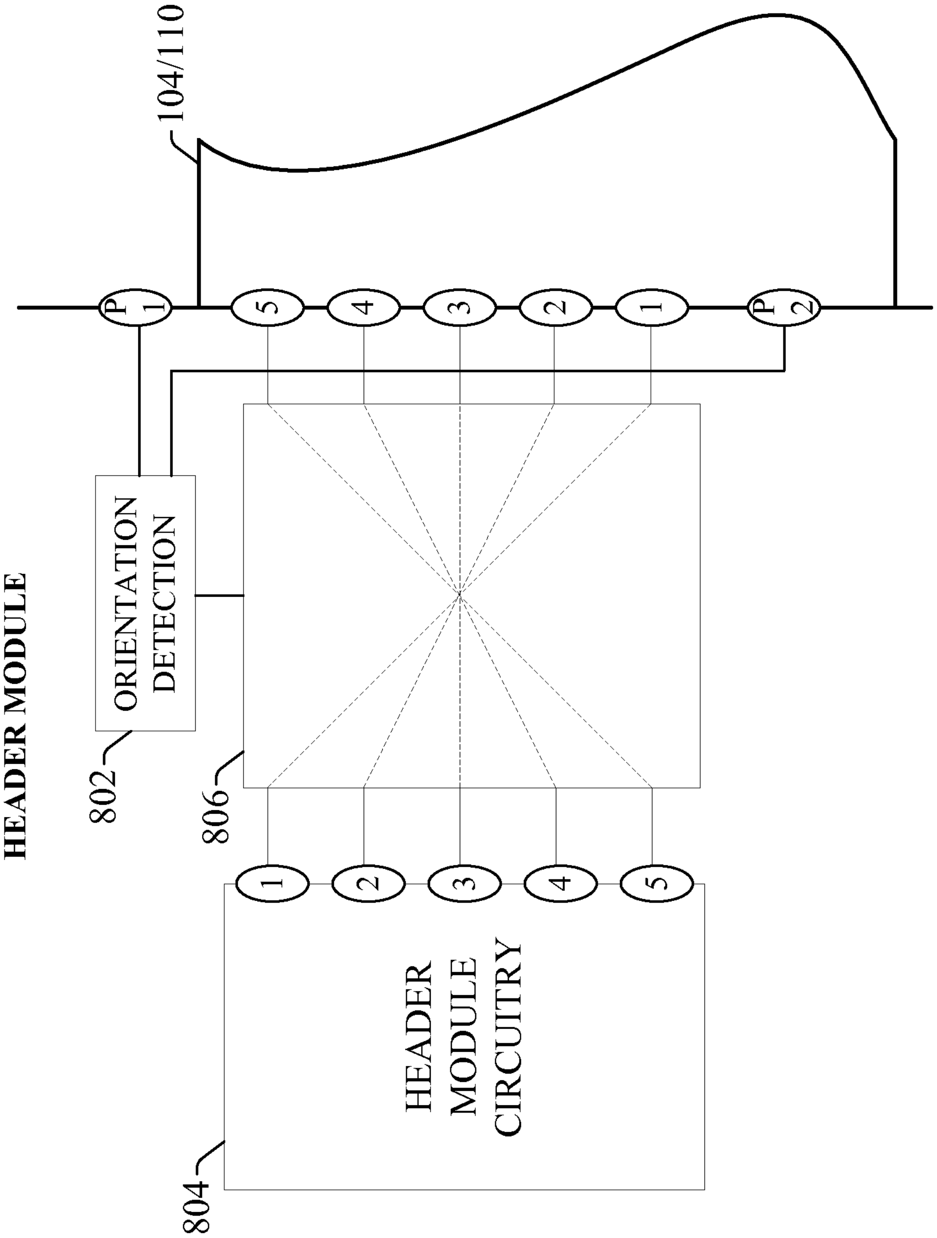
FIG. 8*b* illustrates a header module interface that automatically configures electrical connections between an adapter module and header module circuitry based on detection of a second adapter module orientation.

In another example design, the header interface 112 may comprise only a single row of electrical contacts, the pin-outs of which can be electronically reconfigured using circuitry and/or software within the header module 102 depending on the orientation of the adapter module 104 (or field module 110). FIGS. 8*a* and 8*b* illustrate an example design that automatically reconfigures the contacts of the header interface 112 based on a detected orientation of the adapter module 104 (or field module 110). In this example, the header interface 112 includes an orientation detection component 802 that determines whether the adapter (or field) module is connected in the first or second orientation. In an example design, header interface 112 may include two additional contacts (P1 and P2) for identifying the orientation of the adapter or field module. In this example, when the adapter module 104 (or field module 110) is connected to the header module in the first orientation, as shown in FIG. 8*a*, a position detection contact on the adapter or field module interface makes contact with a corresponding first position detection contact P1 on the header interface. Orientation detection component 802 detects this connection and configures pin-out circuitry 806 to electronically connect the contacts of the header interface to the appropriate nodes of header module circuitry 804. Alternatively, when the adapter module 104 (or field module 110) is connected to the header module in the second orientation, as illustrated in FIG. 8*b*, the orientation detection contact of adapter module 104 (or field module 110) makes contact with a corresponding second position detection contact P2 on the header interface. Accordingly, orientation detection component 802 configures pin-out circuitry 806 to cross-connect the contacts of the header interface relative to the first orientation, ensuring that the contacts of adapter module 104 (or field module 110) connect to the correct nodes of header module circuitry 804 in this orientation without the need to manually rewire the modules.

Some embodiments of the orientation detection component 802 can be configured to delay the electrical connection between the header module and adapter/field module signal lines until the relative orientation of the modules is resolved. In such embodiments, the pin-out circuitry 806 may be initially configured to prevent signaling throughput between the pins of the adapter/field module and the header module circuitry 804. When the adapter/field module is initially connected to the header module, the pin-out circuitry 806 prevents signal throughput until orientation detection component 802 positively confirms which of the two orientations has been selected. In response to determining the orientation, the orientation detection component 802 will configure the correct signaling connectivity in pin-out circuitry 806, and instruct the pin-out circuitry to allow signaling throughput between the two modules. By delaying the signaling throughput until the module orientation is positively confirmed, the design can prevent momentarily incorrect signal connections between the adapter/field module and header module at the moment the modules are physically connected.

Any suitable technique for determining an orientation of the adapter or field module is within the scope of one or more embodiments of this disclosure. For example, in one or more embodiments the orientation detection function can be performed without using additional contacts P1 and P2, but rather by sensing the polarity of the DC power input and ground contacts, or by sensing the direction of current through an orientation detection circuit (which can be a function of the module orientation).

Other automatic configuration capabilities are also considered. For example, in one or more embodiments, if the adapter module comprises a serial interface, the header and/or adapter module may initiate arbitration and detection between the header module and the adapter module. One or both of the header module and/or adapter module can then automatically adjust a module configuration based on a result of the arbitration and detection.

Figure 9A:
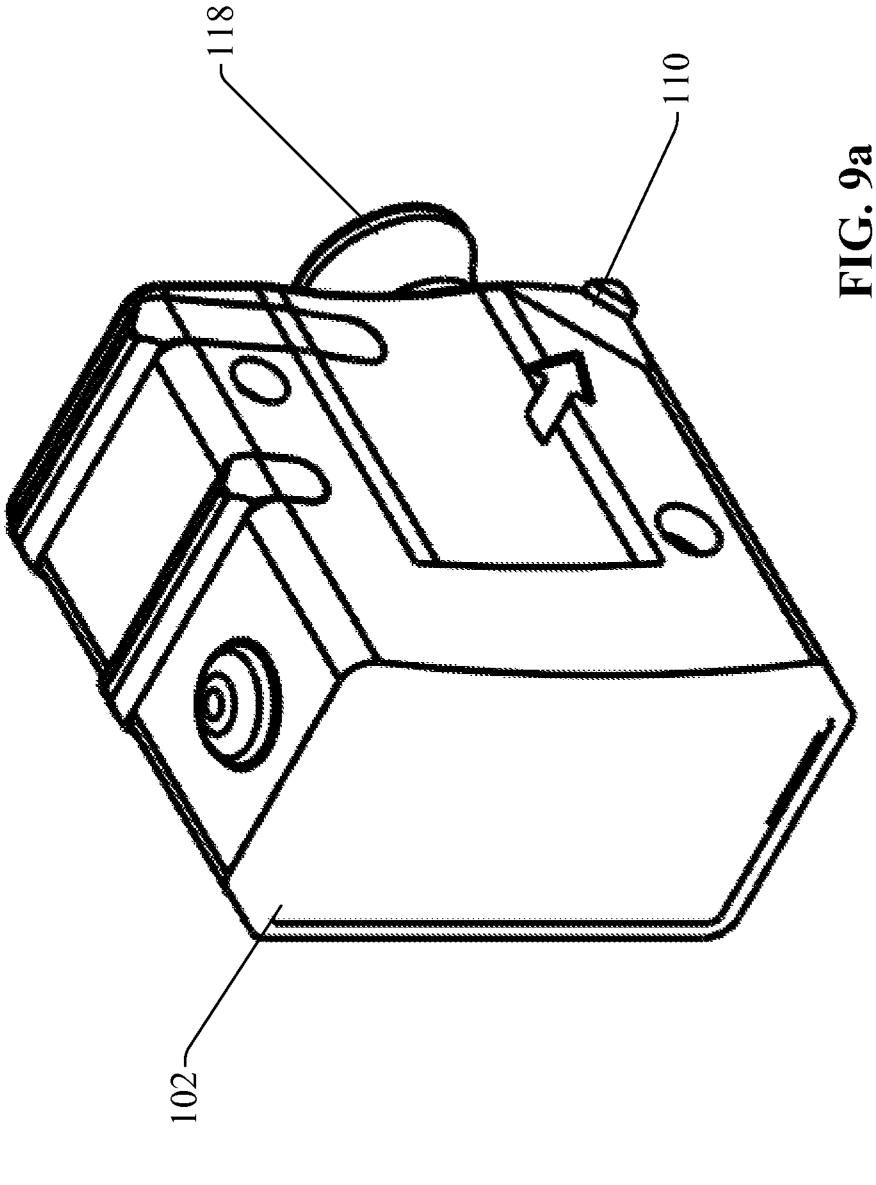
FIG. 9*a* is a three-dimensional view of a field module attached to a header module in a first orientation.

As noted above, the connector design described above in connection with adapter module 104 can also be used to attach a field module to header module 102. FIG. 9*a* illustrates a three-dimensional view of a field module 110 attached to header module 102 in a first orientation. FIG. 9*b* is a two-view drawing of the resulting sensor assembly. Similar to adapter interface 106, field module interface 108 includes a single row of electrical contacts that is configured to connect to one of the two rows of corresponding electrical contacts 502*a* and 502*b* of header interface 112, depending on the orientation of field module 110. As shown in FIG. 9*b*, field module interface 108 interfaces with the upper row of contacts 502*a* of header interface 112 while in the first orientation.

Figure 10A:
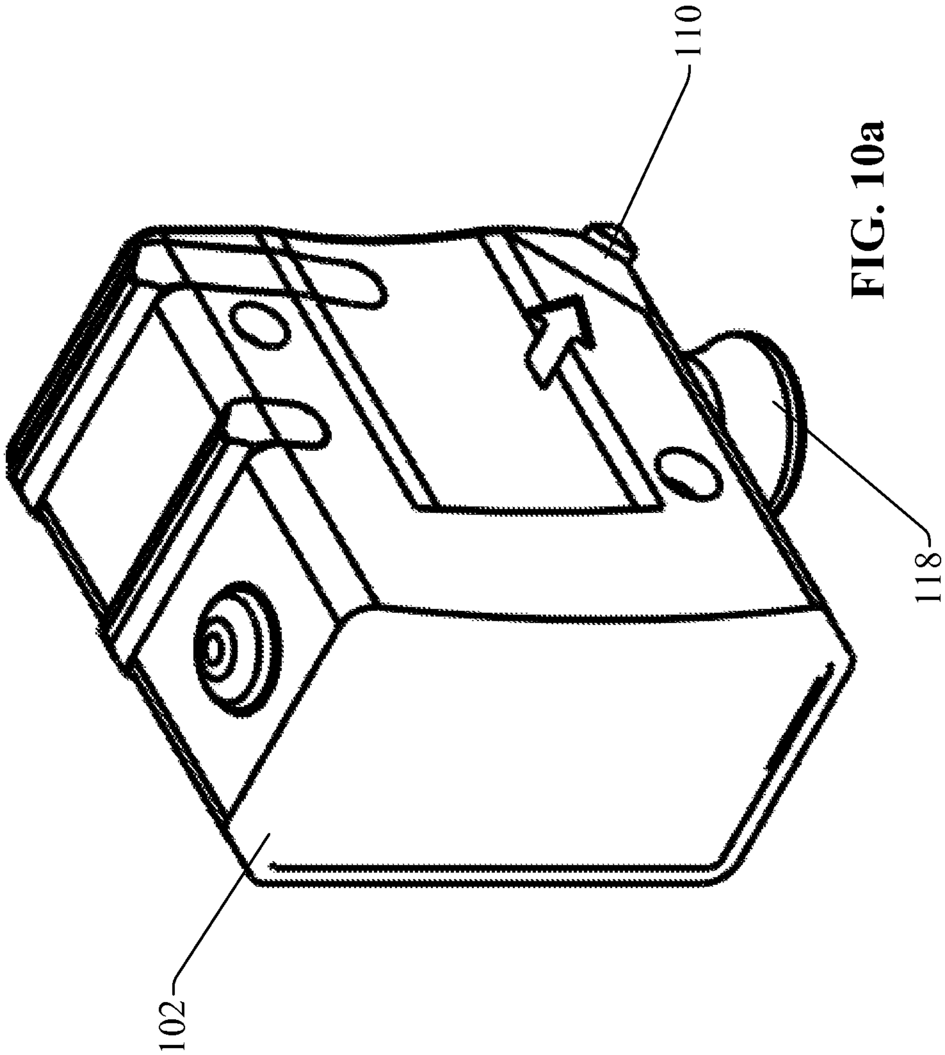
FIG. 10*a* is a three-dimensional view of a field module attached to header module in a second orientation.

FIG. 10*a* is a three-dimensional view of field module 110 attached to header module 102 in the second orientation, which is obtained by rotating field module 110 180 degrees relative to the first orientation. FIG. 10*b* is a two-view drawing of the resulting assembly. As shown in this figure, field module interface 108 interfaces with the second row of contacts 502*b* of header interface 112 while in the second orientation.

Figure 11A:
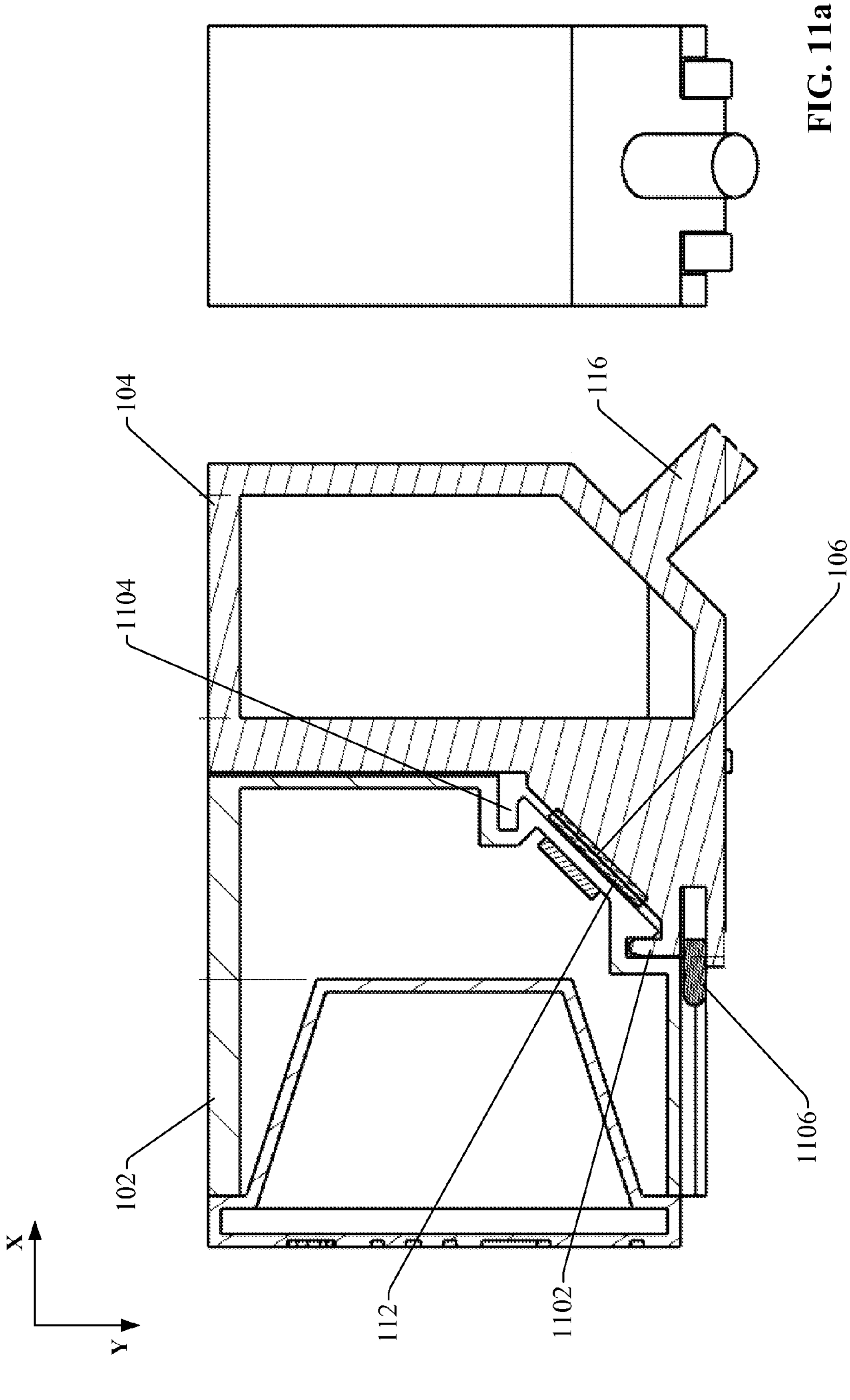
FIG. 11*a* is a two view drawing of an adapter module attached to a header module in a first orientation.
Figure 11B:
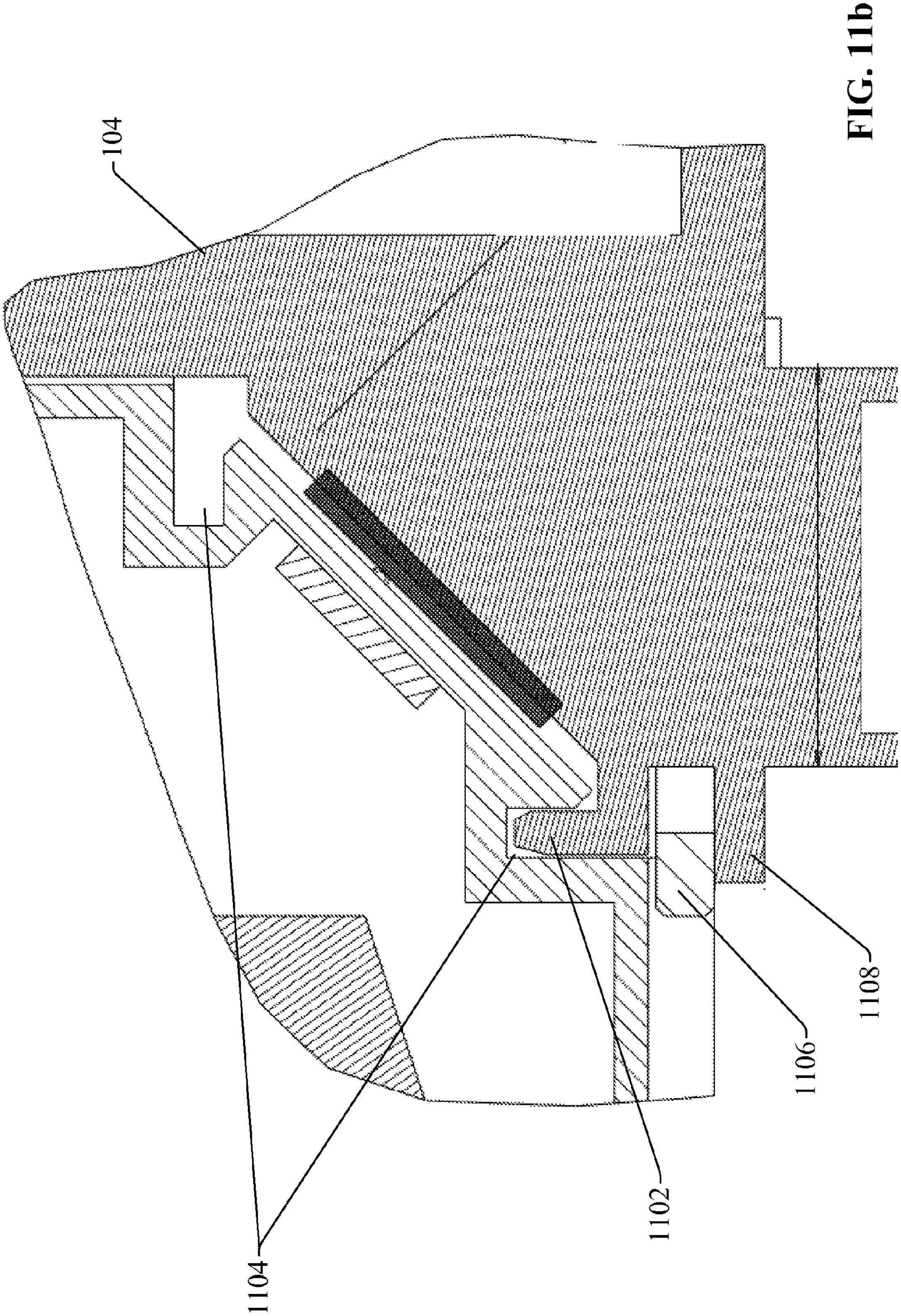
FIG. 11*b* is a cross-sectional view of an interface between an adapter module and a header module.
Figure 11C:
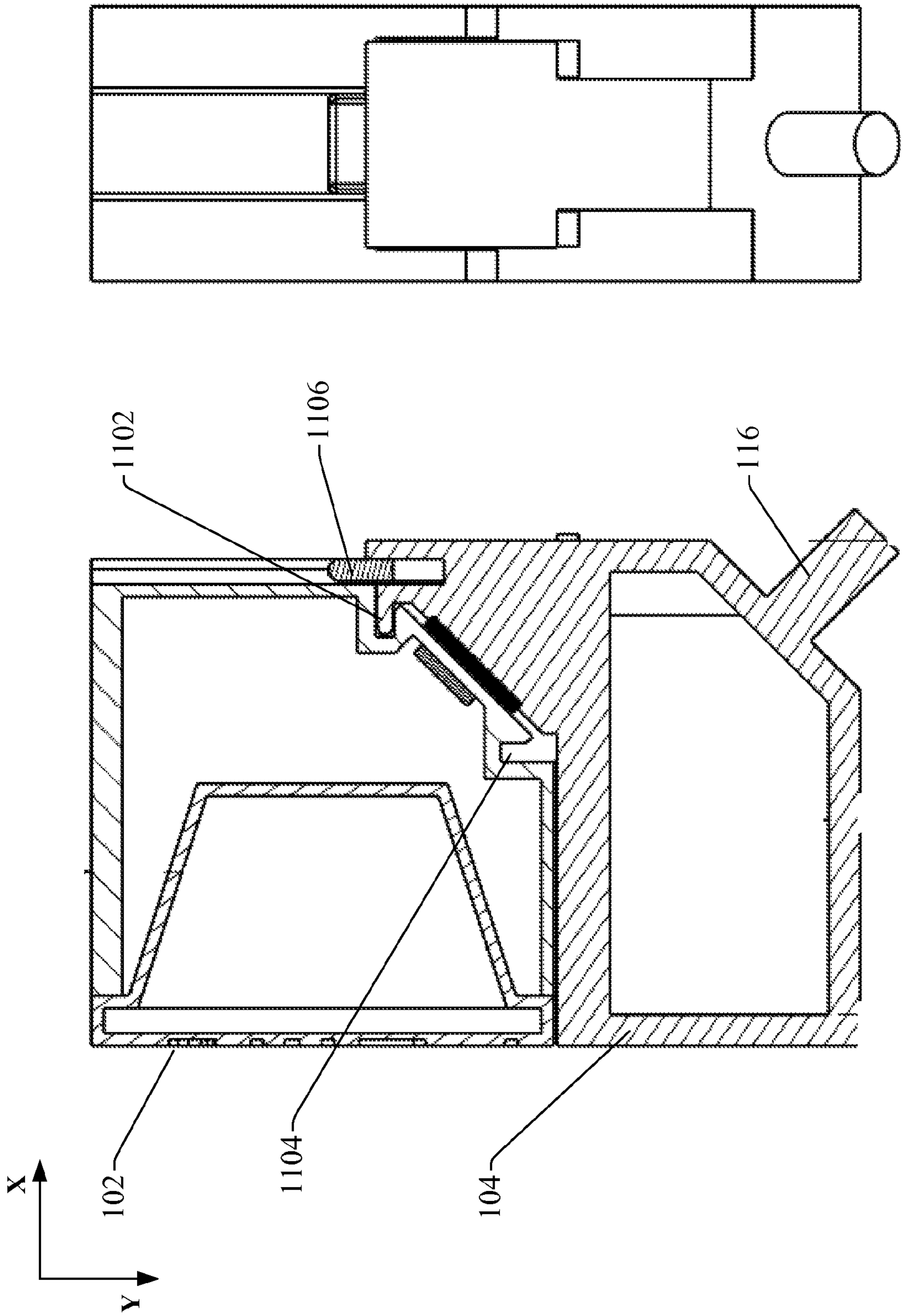
FIG. 11*c* is a two-view drawing of an adapter module attached to a header module in a second orientation.

Although the foregoing examples described the adapter and field modules as comprising guide rails 120 and 124 that are used to align those modules with header module 102 during assembly, it is to be appreciated that any suitable connection mechanism is within the scope of one or more embodiments of this disclosure. For example, FIG. 11*a* is a two-view drawing illustrating an alternative alingment mechanism for joining adapter module 104 with header module 102. In this example, adapter module 104 comprises a locking edge 1102 configured to slot into either of two corresponding locking grooves 1104 of header module 102. FIG. 11*a* depicts adapter module 104 attached in the first orientation, such that locking edge 1102 is slotted into the lower of the two locking grooves 1104. This example design also differs from the previously described design in that adapter module 104 (rather than header module 102) includes a retractable locking tongue 1106 that slots into a groove of header module 102 to facilitate locking adapter module 104 in place. FIG. 11*b* depicts a closer view of this connection mechanism. Although FIGS. 11*a*-11*c* depict the locking tongue 1106 as being retractable under a lip 1108 of the adapter module 104, other embodiments of this locking mechanism may comprise a spring-loaded locking tongue 1106 that is flush with the surface of the adapter module, such that the top surface of the locking tongue 1106 is exposed. This configuration may result in a smoother module surface with fewer raised surfaces, mitigating collection of excess dirt.

FIG. 11*c* illustrates the header module 102 and adapter module 104 attached in the second orientation using this alternative connection mechanism. As shown in this figure, locking edge 1102 of adapter module 104 is now slotted into the upper of the two locking grooves of header module 102. Moreover, retractable locking tongue 1106 is now located on the rear edge of the assembly, and extends into a second groove on this surface of header module 102 to facilitate locking adapter module 104 while in the second orientation.

FIGS. 11*a-c* also illustrate an example adapter module design that maintains the same general position and arrangement of cable port 116 in both orientations, rather than offsetting the direction of cable port 116 by 90 degrees as in previous examples. Specifically, in the example illustrated in FIGS. 11*a-c*, cable port 116 extends from a lower rear corner of the assembly in both the first and second orientations.

The foregoing examples are only intended to be illustrative, and it is to be appreciated that any orientation detection and pin-out reconfiguration techniques are within the scope of one or more embodiments of this disclosure.

The modular connector design described herein offers a number of benefits. For example, the ability to re-orient the adapter and field modules relative the header module without manually rewiring the modules allows the user to physically reconfigure the connector as needed even if the physical limitations of the installation area are not known until installation takes place. Also, by providing a variety of field and adapter modules having different functionalities (e.g., different power conditioning modules, different types of communication modules, etc.), which are physically and electrically compatible with a common header module, can allow customers and distributers to stock lower cost modules rather than complete sensors of different types, thereby lowering inventory costs and allowing for greater design flexibility.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

What is claimed is:

1. A system for modular configuration of an electrical device, comprising:

a header module comprising an electrical component and a header interface comprising a set of electrical contacts that interface with the electrical component, the set of electrical contacts comprising a first row of electrical contacts that are wired to the electrical component and a second row of electrical contacts that are cross-wired to the electrical component relative to the first row; and a function module comprising a module interface electrically connected to conductors of a cable or an interface port, wherein the function module is configured to attach to the header module in two selectable orientations, wherein a row of electrical contacts of the module interface is configured to electrically connect with the first row of electrical contacts while in a first of the two selectable orientations and with the second row of electrical contacts while in a second of the two selectable orientations.

2. The system of claim 1, wherein a first orientation of the two selectable orientations is yielded by rotating the function module 180 degrees or substantially 180 degrees relative to a second orientation of the two selectable orientations.

3. The system of claim 1, wherein the function module comprises a field module configured to conduct direct current (DC) power to the electrical component via the module interface and the header interface.

4. The system of claim 1, wherein the function module comprises an adapter module configured to transform alternating current (AC) power received via the cable or the interface port to yield transformed AC power and provide the transformed AC power to the electrical component via the module interface and the header interface.

5. The system of claim 1, wherein the function module comprises an adapter module configured to process electrical signals passed between the conductors of the cable or the interface port and the electrical component.

6. The system of claim 5, wherein the adapter module comprises a communication module configured to convert the electrical signals to conform to a communication protocol.

7. The system of claim 1, wherein the header interface and the module interface are configured to maintain a same electrical connection between the conductors of the cable or the interface port and the electrical component in both of the two selectable orientations.

8. The system of claim 1, wherein the electrical component comprises at least one of a photo sensor, a proximity switch, a measurement device, a safety switch, a position detection device, a profile detection device, a physical attribute detection device, or a recognition device.

9. A system for selectable configuration of an industrial field device, comprising:

means for connecting a function module to a header module according to a first orientation that creates a first electrical connection between a header interface of the header module and a module interface of the function module, the header module comprising a first row of electrical contacts and a second row of electrical contacts, wherein the first row of electrical contacts are wired to an electrical component housed in the header module and the second row of electrical contacts are cross-wired to the electrical component relative to the first row; and means for connecting the function module to the header module according to a second orientation that creates a second electrical connection between the header interface and the module interface, wherein the first electrical connection connects a row of electrical contacts of the function module to the first row of electrical contacts, and wherein the second electrical connection connects the row of electrical contacts of the function module to the second row of electrical contacts.

10. The system of claim 9, further comprising means for maintaining a same electrical interfacing between a first set of conductors of the electrical component and a corresponding second set of conductors of a cable or port of the function module in both the first orientation and the second orientation.

11. The system of claim 10, wherein the function module comprises means for transforming alternating current (AC) power received via the cable or port to yield transformed AC power.

12. The system of claim 10, wherein the function module comprises means for processing electrical signals passed between the conductors of the cable or port and the electrical component.

13. The system of claim 10, wherein the function module comprises means for processing electrical signals passed between the conductors of the cable or the interface port and the electrical component.

14. The system of claim 13, wherein the means for processing comprises means for converting the electrical signals to conform to a communication protocol.

15. The system of claim 9, wherein the first orientation is oriented 180 degrees or substantially 180 degrees relative to the second orientation.

16. The system of claim 9, wherein the function module comprises means for conducting direct current (DC) power to the electrical component via the module interface and the header interface.

17. The system of claim 9, wherein the electrical component comprises at least one of a photo sensor, a proximity switch, a measurement device, a safety switch, a position detection device, a profile detection device, a physical attribute detection device, or a recognition device.

* * * * *